United States Patent
Kikuchi et al.

(10) Patent No.: US 7,951,249 B2
(45) Date of Patent: May 31, 2011

(54) RFID TAG

(75) Inventors: Shunichi Kikuchi, Kawasaki (JP);
Masumi Suzuki, Kawasaki (JP);
Michimasa Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 934 days.

(21) Appl. No.: 11/704,321

(22) Filed: Feb. 9, 2007

(65) Prior Publication Data

US 2007/0139206 A1    Jun. 21, 2007

Related U.S. Application Data

(63) Continuation of application No. 11/085,491, filed on Mar. 22, 2005, now Pat. No. 7,199,718.

(30) Foreign Application Priority Data

Dec. 16, 2004    (JP) ................................. 2004-364590

(51) Int. Cl.
*B32B 41/00*    (2006.01)
(52) U.S. Cl. ........... 156/64; 156/233; 156/252; 156/256
(58) Field of Classification Search ........... 156/64, 156/233, 252, 256
See application file for complete search history.

(56) References Cited

U.S. PATENT DOCUMENTS

| | | | |
|---|---|---|---|
| 5,867,102 A * | 2/1999 | Souder et al. | 340/572.8 |
| 6,100,804 A | 8/2000 | Brady et al. | |
| 6,147,604 A | 11/2000 | Wiklof et al. | |
| 6,215,401 B1 | 4/2001 | Brady et al. | |
| 6,265,977 B1 | 7/2001 | Vega et al. | |
| 6,294,998 B1 | 9/2001 | Adams et al. | |
| 6,424,315 B1 * | 7/2002 | Glenn et al. | 343/895 |
| 6,451,154 B1 * | 9/2002 | Grabau et al. | 156/300 |
| 2004/0074974 A1 * | 4/2004 | Senba et al. | 235/492 |

FOREIGN PATENT DOCUMENTS

| | | |
|---|---|---|
| JP | 11-067993 A | 3/1999 |
| JP | 2001-024107 A | 1/2001 |
| JP | 2001-109869 A | 4/2001 |
| JP | 2001-160606 A | 6/2001 |
| JP | 2002-525726 | 8/2002 |
| JP | 2004-079949 A | 3/2004 |
| WO | WO 00/16286 | 3/2000 |

OTHER PUBLICATIONS

Japanese Office Action dated Nov. 2, 2010, issued in corresponding Japanese Patent Application No. 2004-364590. (partial translation).

\* cited by examiner

*Primary Examiner* — George R Koch, III
(74) *Attorney, Agent, or Firm* — Westerman, Hattori, Daniels & Adrian, LLP

(57) ABSTRACT

The present invention provides an RFID tag excellent in the diffusion of heat. The RFID tag includes a base, an antenna pattern that is provided on the base and forms a communication antenna, a circuit chip that is electrically connected to the antenna pattern and performs radio communication via the antenna, a cover that is provided in close contact with the base in such a manner as to cover the antenna pattern except a prescribed region including the circuit chip, and an insulating thermal diffusion material that covers the prescribed region and is in thermal contact with the circuit chip. The insulating thermal diffusion material has thermal conductivity higher than the thermal conductivity of the cover.

5 Claims, 13 Drawing Sheets

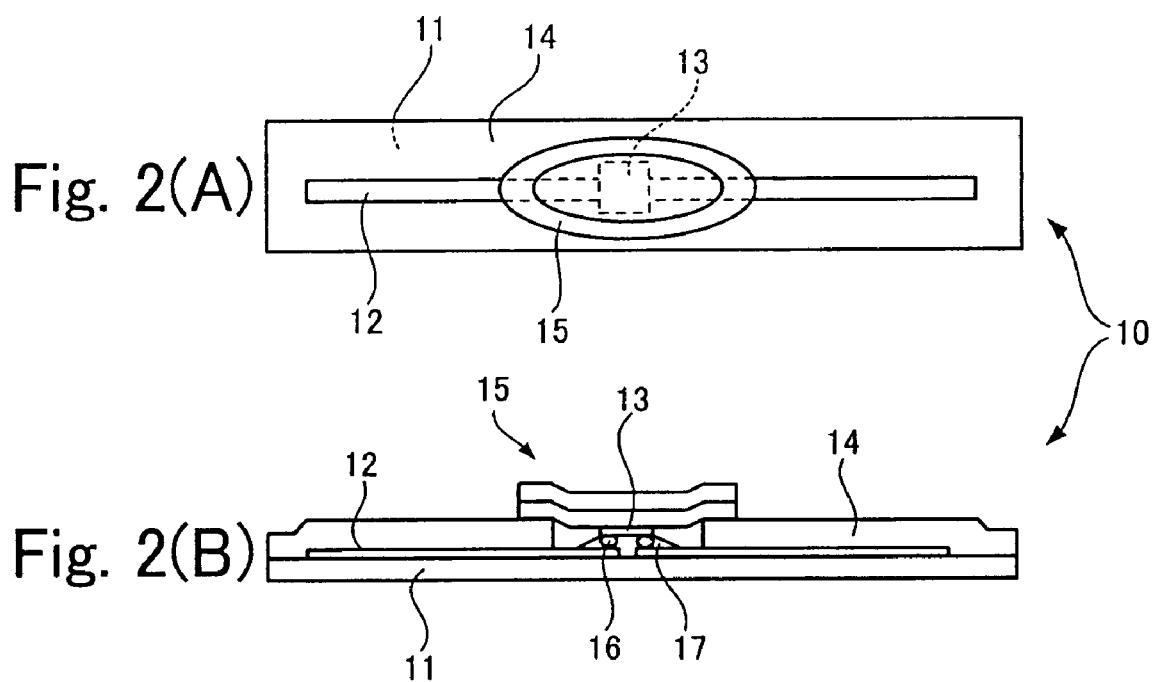

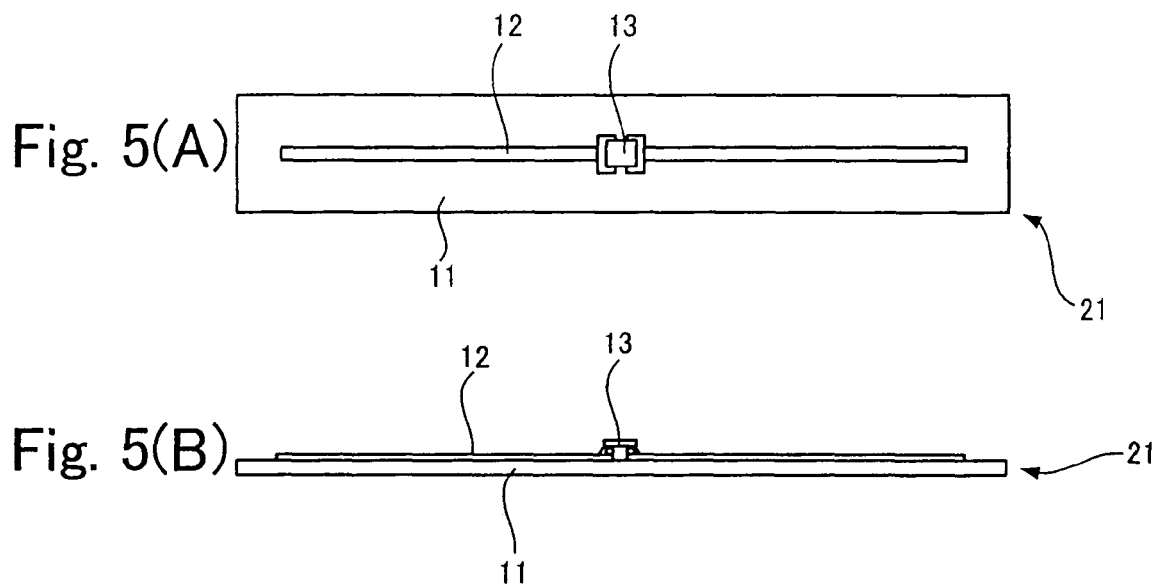

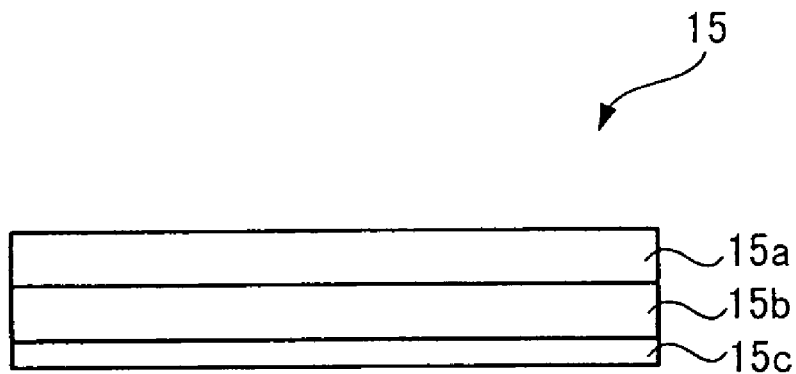
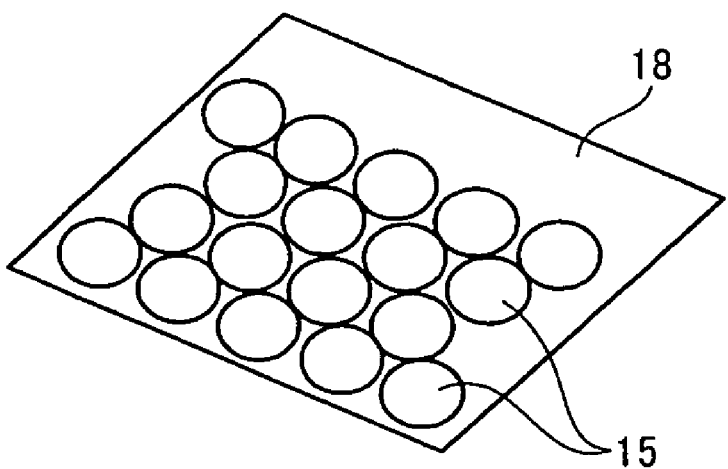

RFID TAG

CROSS-REFERENCE TO RELATED APPLICATION

This application is a Continuation application of application Ser. No. 11/085,491, filed Mar. 22, 2005, now U.S. Pat. No. 7,199,718, the entire disclosure of which is hereby incorporated by reference.

BACKGROUND OF THE INVENTION

1. Field of the Invention

The present invention relates to an RFID (Radio Frequency Identification) tag that performs information exchange with external equipment in a noncontact manner. Incidentally, among those skilled in the art related to the technical field of the present application, the "RFID tag" used in the specification of the present application may sometimes be called an "inlay for RFID tag" by regarding the "RFID tag" as an internal component member (inlay) for "RFID tag." Or alternatively, in some cases, this "RFID tag" may be referred to as "a radio IC tag." Also, a noncontact type IC card is included in this "RFID tag."

2. Description of the Related Art

In recent years, there have been proposed various RFID tags that perform information exchange with external equipment represented by a reader/writer in a noncontact manner by use of radio waves. As one kind of this RFID tag, there has been proposed an RFID tag in which an antenna pattern for radio communication and an IC chip are mounted on a base sheet made of plastics or paper. A conceived mode of using an RFID tag of this type is such that the RFID tag is stuck to an article and the like and performs the identification of the article by exchanging information on the article with external equipment.

In such RFID tags, it has been proposed that a cover that covers a base sheet be provided in order to protect an antenna pattern or an IC chip.

FIGS. 1(A) and 1(B) are a front view and a side view, respectively, of a conventional RFID tag. The side view shown here is a drawing in which the internal structure is seen through from the side-surface side of the RFID tag. In this specification, drawings hereinafter called a side view are all similar drawings.

An RFID tag 1 shown in FIGS. 1(A) and 1(B) is constituted by an antenna pattern 3 provided on a base sheet 2, an IC chip 4 that is bonded to the base sheet 2 with an epoxy adhesive 7 and electrically connected to the antenna pattern 3 via a bump 5, and a cover sheet 6 bonded to the base sheet 2 in such a manner as to cover the antenna pattern 3 and the IC chip 4. The cover sheet 6 is usually formed from a material selected from among PET materials, polyester materials, polyolefin materials, polycarbonate materials, acrylic materials, etc.

This RFID tag 1 receives the energy of an electromagnetic field released by a reader/writer as electric energy by use of the antenna pattern 3 and the IC chip 4 is driven by the electric energy, whereby the communication action is realized.

In the RFID tag 1 constructed as described above, the height of the IC chip 4 portion is larger than the height of other portions. Therefore, when something rubs the cover sheet 6 of the RFID tag 1 and when the RFID tag 1 is used in such a manner as to be sandwiched between books, impacts and loads are concentrated on the IC chip 4 and this might cause troubles in the IC chip 4 and faults such as the exfoliation of the IC chip 4. Furthermore, there is also a possibility that the stretch or sag of the cover sheet 6 occurs near the IC chip 4, generating residual stresses, with the result that the cover sheet 6 might come off due to the residual stresses.

Compared to such RFID tags of typical structure, there have also been proposed RFID tags in which ideas for protecting IC chips are incorporated (refer to, for example, U.S. Pat. No. 6,100,804, U.S. Pat. No. 6,265,977, U.S. Pat. No. 6,147,604, U.S. Pat. No. 6,215,401 and U.S. Pat. No. 6,294,998). In RFID tags disclosed in these patent documents, an IC chip is embedded in a sealing member or an intermediate layer and the surface of the RFID tag is made flush, whereby the concentration of impacts and loads on the IC chip are avoided.

However, in such conventional RFID tags, the heat generated by the IC chip is captured and confined in due to the presence of the sealing member and the intermediate layer and this might cause malfunctions of the IC chip. Also, in the case of the RFID tag 1 of a typical construction as shown in FIGS. 1(A) and 1(B), the thermal conductivity of the cover sheet 6 is low, the thermal capacity of the IC chip 4 itself is also low and, besides, also between the IC chip 4 and the antenna pattern 3, the greater part except the portion of the bump 5 is embedded with an epoxy adhesive 7 and the thermal resistance by connection is large. For this reason, heat is apt to be captured and confined in the IC chip 4. Therefore, in a case where the RFID tag 1 is present near a reader/writer and subjected to a strong electromagnetic field, it might be thought that the temperature rises abruptly due to the heat generated in the IC chip 4. Such an abrupt temperature rise might cause malfunctions of the IC chip 4. Also, in a case where the temperature of an article to which the IC chip 4 is stuck is constantly a high temperature of 50° C. to 70° C., even when the RFID tag 1 is placed at a distance from a reader/writer, there is a possibility that a critical temperature for the stable operation in a transistor within the IC chip 4 and a critical temperature for long-term memory holding might be exceeded due to the heat generation from the IC chip 4.

SUMMARY OF THE INVENTION

The present invention has been made in view of the above circumstances and provides an RFID tag excellent in the diffusion of heat.

An RFID tag of the present invention includes: a base; an antenna pattern that is provided on the base and forms a communication antenna; a circuit chip that is electrically connected to the antenna pattern and performs radio communication via the antenna; a cover that is provided in close contact with the base in such a manner as to cover the antenna pattern except a prescribed region including the circuit chip; and an insulating thermal diffusion material that covers the prescribed region and is in thermal contact with the circuit chip, the insulating thermal diffusion material having thermal conductivity higher than the thermal conductivity of the cover.

According to an RFID tag of the invention, because the thermal diffusion material is provided, the RFID tag is excellent in the diffusion of heat and malfunctions by heat and the like are prevented. Also, because the cover does not cover the circuit chip, the coming off of the cover due to residual stresses as described above is also prevented.

It is preferred that in the RFID tag, the thermal diffusion material be provided with a center part on the circuit chip and a protective part that encloses the center part, the height of the protective part being larger than the height of the center part.

By providing the thermal diffusion material having this protective part, the concentration of impacts and loads on the circuit chip can be avoided.

The thermal diffusion material in the RFID tag of the invention may be formed by bonding a sheet-like member to the prescribed region or may be a liquid material that is applied to the prescribed region and has solidified.

Such a thermal diffusion material as described above can be provided only in an accepted product after an operation test in the process of manufacturing RFID tags and it becomes easy to distinguish between accepted products and rejected products. When a liquid material is used, the manufacturing process becomes simple and cost reduction is expected.

The thermal diffusion material in the RFID tag of the invention may be an insulating material into which a thermally conductive granule having thermal conductivity higher than the thermal conductivity of the insulating material is mixed or the thermal diffusion material may have a lamellar structure including a first layer and a second layer having thermal conductivity higher than the thermal conductivity of the first layer.

The case of the thermal diffusion material into which the thermally conductive granule is mixed, is excellent in that an RFID tag of high thermal conductivity can be easily obtained. The case of the thermal diffusion material having the lamellar structure, is excellent in that an RFID tag excellent in both strength and the diffusion of heat can be easily obtained.

As described above, the RFID tag of the invention is excellent in the diffusion of heat and malfunctions of the circuit chip by heat and the like can be prevented.

BRIEF DESCRIPTION OF THE DRAWINGS

Preferred embodiments of the present invention will be described in detail based on the following figures, wherein:

FIGS. 2(A) and 2(B) are a front view and a side view, respectively, of the first embodiment of the present invention;

FIGS. 5(A) and 5(B) are a front view and a side view, respectively, of a semifinished product;

FIGS. 7(A) and 7(B) are each a detail drawing of a thermal diffusion material;

DETAILED DESCRIPTION OF THE INVENTION

Figures 1A, 1B:
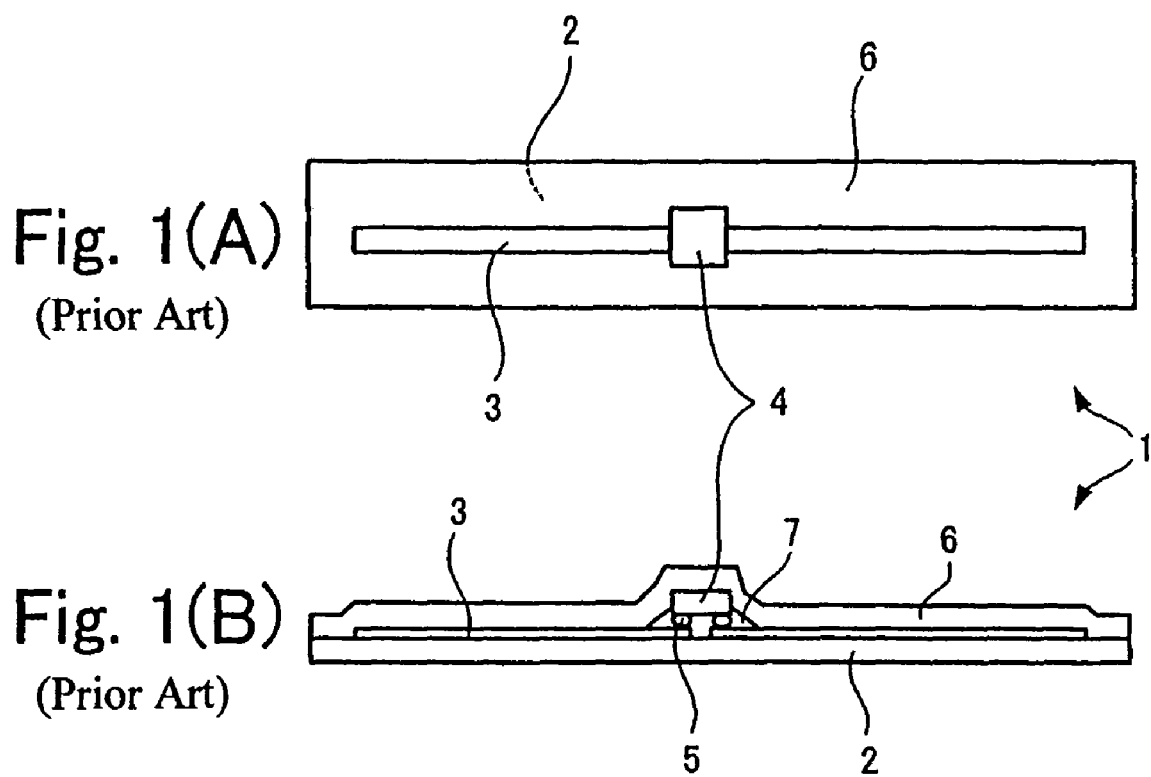
FIGS. 1(A) and 1(B) are a front view and a side view, respectively, of a conventional RFID tag.

Embodiments of the present invention will be described below by referring to the drawings.

FIGS. 2(A) and 2(B) are a front view and a side view, respectively, of the first embodiment of the present invention.

An RFID tag 10 shown in FIGS. 2(A) and 2(B) is constituted by an antenna pattern 12 provided on a base sheet 11, an IC chip 13 that is bonded to the base sheet 11 with an epoxy adhesive 17 and electrically connected to the antenna pattern 12 via a bump 16, a cover sheet 14 bonded to the base sheet 11 in such a manner as to cover the antenna pattern 12 except an area near the IC chip 13, and a thermal diffusion material 15 bonded to the cover sheet 14 and the IC chip 13 from above the IC chip 13.

Also this RFID tag 10 receives the energy of an electromagnetic field released by a reader/writer as electric energy by use of the antenna pattern 12 and the IC chip 13 is driven by the electric energy, whereby the communication action is realized.

In this first embodiment, the base sheet 11 corresponds to an example of the base of the invention, the antenna pattern 12 corresponds to an example of the antenna pattern of the invention, the IC chip 13 corresponds to an example of the circuit chip of the invention, the cover sheet 14 corresponds to an example of the cover of the invention, and the thermal diffusion material 15 corresponds to an example of the thermal diffusion material of the invention.

Although the cover sheet 14 is formed from a PET material, the cover sheet 14 may also be formed from a material selected from among polyester materials, polyolefin materials, polycarbonate materials, acrylic materials, etc. The bonding of the IC chip 13 is possible by using an epoxy film in place of the epoxy adhesive 17.

Although details of the construction of the thermal diffusion material 15 will be given layer, this thermal diffusion material 15 has thermal conductivity higher than the thermal conductivity of the cover sheet 14 and holds the temperature of the IC chip 13 at low levels by efficiently diffusing the heat generated by the IC chip 13 into the air and the like, thereby making it possible to realize stable operation and the like. Furthermore, because the structure in which this thermal diffusion material 15 is bonded from above the IC chip 13 does not cause the stretch or sag of the cover sheet 15, there is no possibility that the thermal diffusion material 15 and the cover sheet 14 might come off due to residual stresses.

The method of manufacturing the RFID tag 10 will be described below.

Figure 3:
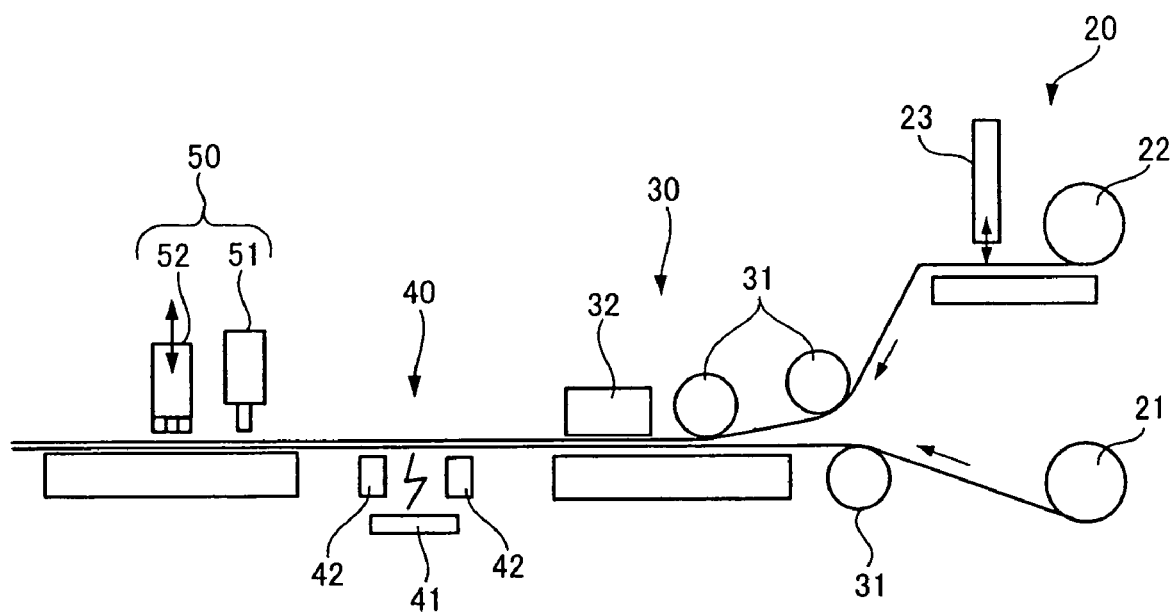
FIG. 3 is a conceptual diagram of the process of manufacturing an RFID tag.

FIG. 3 is a conceptual diagram of the process of manufacturing an RFID tag.

The RFID tag 10 shown in FIGS. 2(A) and 2(B) is manufactured from a semifinished product 21 of an RFID tag and a laminate film 22 by undergoing a perforation step 20, a laminating step 30, a test step 40 and a thermal diffusion material addition step 50.

In the perforation step 20, holes are made in the laminate film 22 by use of a perforating jig 23. In the laminating step 30, a sheet in which a large number of semifinished products 21 are linked together and the laminate film 22 are transferred by transfer rolls 31 and superposed on each other, and the semifinished product 21 and the laminate film 22 are bonded together by being heated and pressurized by a thermocompression device 32. In the test step 40, an operation test of an IC chip 13 in a region enclosed with electromagnetic shields 42 by use of a reader/writer 41 is performed to ascertain whether the product has a capacity necessary for an RFID tag. In the thermal diffusion material addition step 50, a silicone grease, which is a kind of thermally conductive grease, is applied by use of a dispenser 51 and the thermal diffusion material is stuck by use of a sticking jig 52.

Figure 4:
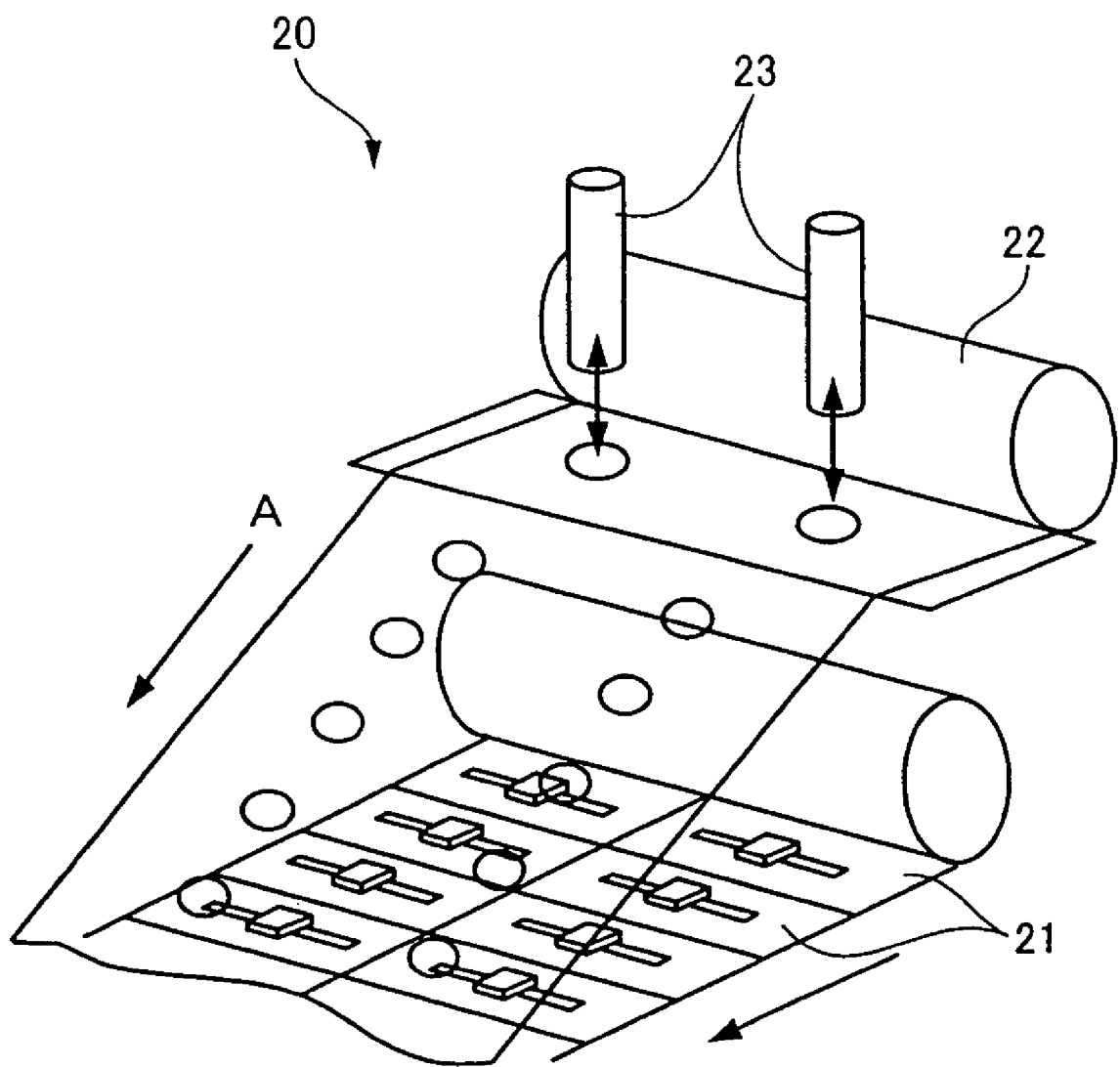
FIG. 4 is a detail drawing of the perforation step shown in FIG. 3.

FIG. 4 is a detail drawing of the perforation step 20 shown in FIG. 3.

In this perforation step 20, holes are made by the perforating jigs 23 in places corresponding to the IC chip 13 of FIGS. 2(A) and 2(B) in the laminate film 22 of a PET material that constitutes the cover sheet 14 shown in FIGS. 2(A) and 2(B). The laminate film 22 in which holes have been made is transferred in the direction indicated by an arrow A in the figure and superposed on a sheet in which a large number of semifinished products 21 are linked together. And the laminate film 22 superposed on the sheet containing the semifinished products 21 is delivered to the laminating step 30 shown in FIG. 3.

FIGS. 5(A) and 5(B) are a front view and a side view, respectively, of a semifinished product.

In FIGS. 5(A) and 5(B), one of many semifinished products 21 that are linked together in sheet form is illustrated, and in this semifinished product 21, the antenna pattern 12 and the IC chip 13 are provided in an exposed condition on the base sheet 11. The method of manufacturing this semifinished product 21 itself is the same as used in the manufacture of conventional RFID tags and is not directly related to the present invention. Therefore, a description of the method of manufacturing this semifinished product 21 is omitted here.

Figure 6A:
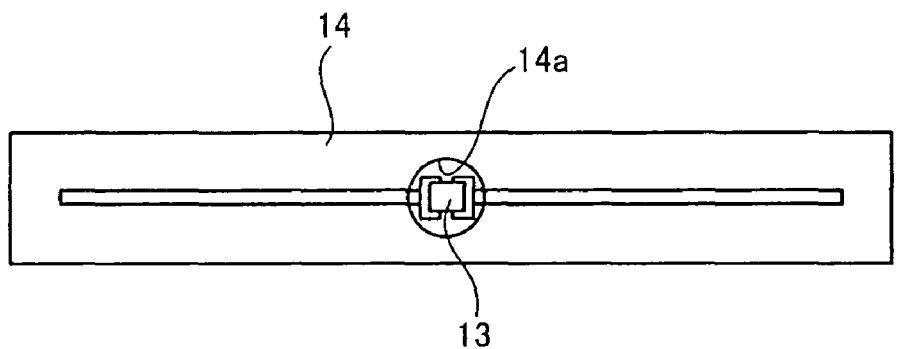
FIGS. 6(A) and 6(B) are a front view and a side view, respectively, of an intermediate product after the laminating step.
Figure 6B:
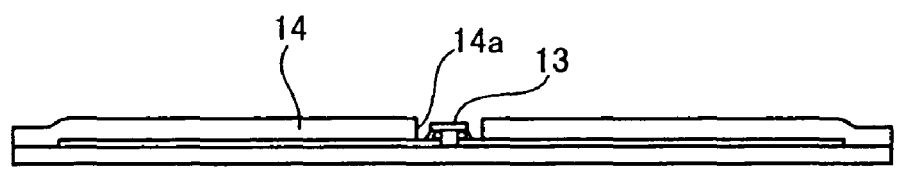

FIGS. 6(A) and 6(B) are a front view and a side view, respectively, of an intermediate product after the laminating step.

Also in FIGS. 6(A) and 6(B), one of semifinished products 21 that are essentially linked together in a large quantity in sheet form is illustrated.

As shown in FIGS. 6(A) and 6(B), the cover sheet 14 is formed in the laminating step and in this cover sheet 14 a hole 14a is made in a part corresponding to the IC chip 13.

This intermediate product is delivered to the test step 40 shown in FIG. 3 to ascertain whether the intermediate product has a capacity necessary for functioning as an RFID tag. For a rejected product that has been judged to have an insufficient capacity in this test step 40, its position in the sheet in which many intermediate products are linked together is recorded, and this rejected product is delivered as it is to the thermal diffusion material addition step 50 shown in FIG. 3.

FIGS. 7(A) and 7(B) are each a detail drawing of a thermal diffusion material.

Details of the lamellar structure of the thermal diffusion material 15 are shown in FIG. 7(A). The thermal diffusion material 15 has a lamellar structure constituted by an insulating silicone rubber sheet 15a, an electrically conductive graphite sheet 15b and an insulating, sticky polyimide tape 15c. For the thickness of each layer, thicknesses of 20 µm to 100 µm are suitable for the silicone rubber sheet 15a, thicknesses of 10 µm to 100 µm are suitable for the graphite sheet 15b, and thicknesses of 20 µm to 50 µm are suitable for the polyimide tape 15c. The silicone rubber sheet 15a has strength higher than the strength of the graphite sheet 15b, while the graphite sheet 15b has thermal conductivity higher than the thermal conductivity of the silicone rubber sheet 15a. For this reason, the thermal diffusion material 15 is tough and excellent in thermal diffusion. The silicone rubber sheet 15a corresponds to an example of the first layer of the invention, and the graphite sheet 15b corresponds to an example of the second layer of the invention. The polyimide tape 15c is a kind of sticky material and the thermal diffusion material 15 is bonded to the intermediate product with the polyimide tape 15c.

As shown in FIG. 7(B), this thermal diffusion material 15 as described above is obtained by punching a sheet 18 and shaped like a patch, and this patch-like thermal diffusion material 15 is stuck in the thermal diffusion material addition step in such a manner as to block the hole 14a of the intermediate product shown in FIGS. 6(A) and 6(B).

Figure 8:
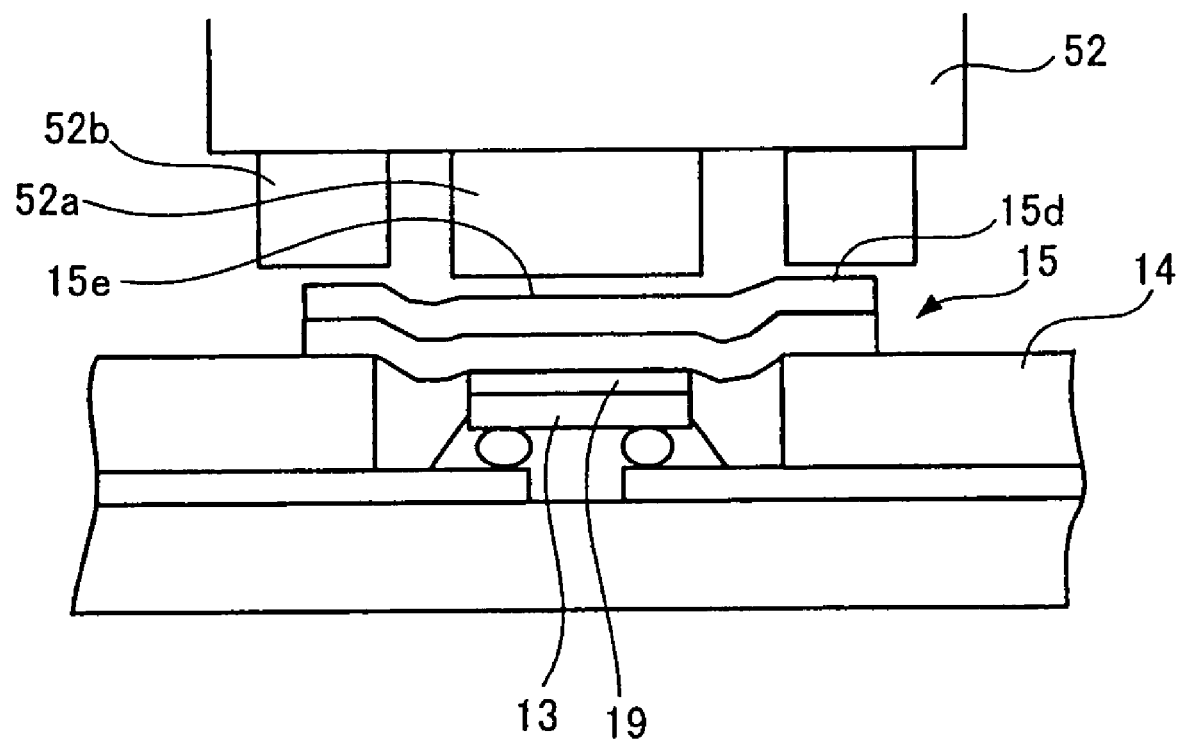
FIG. 8 is an explanatory drawing of the thermal diffusion material addition step shown in FIG. 3.

FIG. 8 is an explanatory drawing of the thermal diffusion material addition step 50 shown in FIG. 3. In this figure, however, only part of the step at which the thermal diffusion material is stuck by use of the sticking jig is shown.

For an intermediate product that has been accepted in the operation test in the test step, a silicone grease 19 to improve adhesion to the thermal diffusion material 15 is applied to the IC chip 13 by use of the dispenser 51 shown in FIG. 3, and the thermal diffusion material 15 is stuck on the silicone grease 19 by use of the stacking jig 52. On the other hand, for an intermediate product that has been rejected in the operation test and its position has been recorded as a rejected product, neither the application of the silicone grease 19 nor the sticking of the thermal diffusion material 15 is performed, and this rejected product is left as an intermediate product. As a result of this, accepted products can be distinguished at a glance from rejected products and the mixing of rejected products is prevented. Incidentally, although wax-based phase-changing materials that liquefy by the application of heat can be adopted in place of thermally conductive greases represented by this silicone grease 19, in this embodiment the silicone grease 19 is to be used.

The sticking jig 52 has a center projection 52a that pushes a center part 15e of the thermal diffusion material 15 against the IC chip 13, and a ring 52b that pushes an edge part 15d of the thermal diffusion material 15 against the cover sheet 14, and the height of the center projection 52a is larger than the height of the ring 52b. For this reason, the height of the edge part 15d of the thermal diffusion material 15 bonded to the cover sheet 14 by the ring 52b is larger than the height of the center part 15e of the thermal diffusion material 15 pushed against the IC chip 13 by the center projection 52a. This center part 15e corresponds to an example of the center part of the invention and the edge part 15d corresponds to an example of the protective part of the invention.

Because the height of the edge part 15d is larger than the height of the center part 15e in this manner, impacts and loads on the RFID tag are applied to the edge part 15d and impacts and loads on the center part 15e and the IC chip 13 are relieved, with the result that the breakage and exfoliation of the IC chip 13 are prevented.

With this the description of the first embodiment of the present invention is finished, and other embodiments of the invention will be described below. Incidentally, each of the embodiments described below is the same as the first embodiment described above, with the exception that different thermal diffusion materials are used. Therefore, the following descriptions will be given by paying attention to only differences from the first embodiment and overlaps in descriptions will be avoided.

Figure 9:
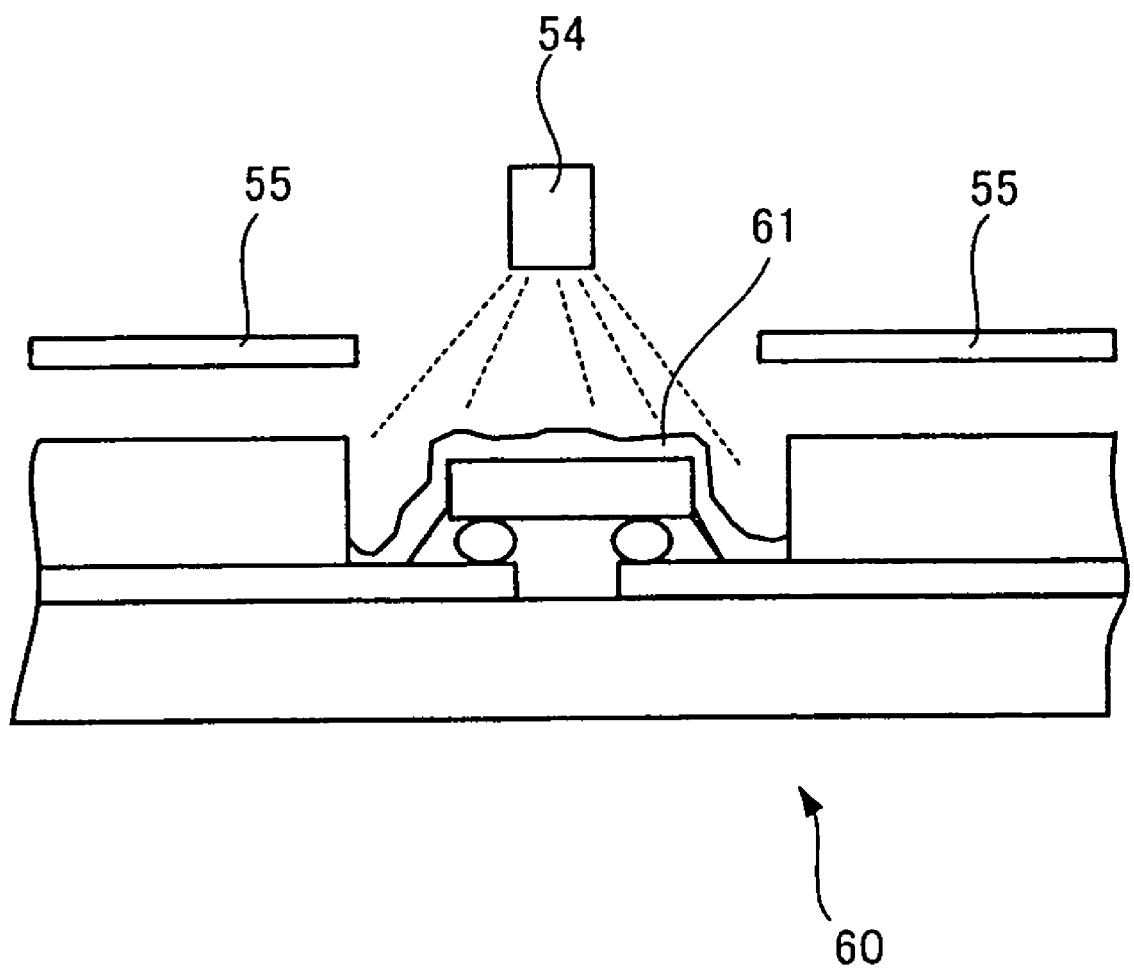
FIG. 9 is a drawing that shows the second embodiment of the invention.

FIG. 9 is a drawing that shows the second embodiment of the invention.

An RFID tag 60 of the second embodiment shown in FIG. 9 is provided with a thermal diffusion material 61 formed from a ceramic ($Al_2O_3$: alumina, $SiO_2$: silica) powder. This thermal diffusion material 61 is formed by blowing a liquid ceramic paint (for example, the ceramic α made by Oki Electric Industry Co., Ltd.) from a nozzle 54 through an opening of a mask 55 and causing the liquid ceramic paint to solidify by drying or the like.

Figure 10:
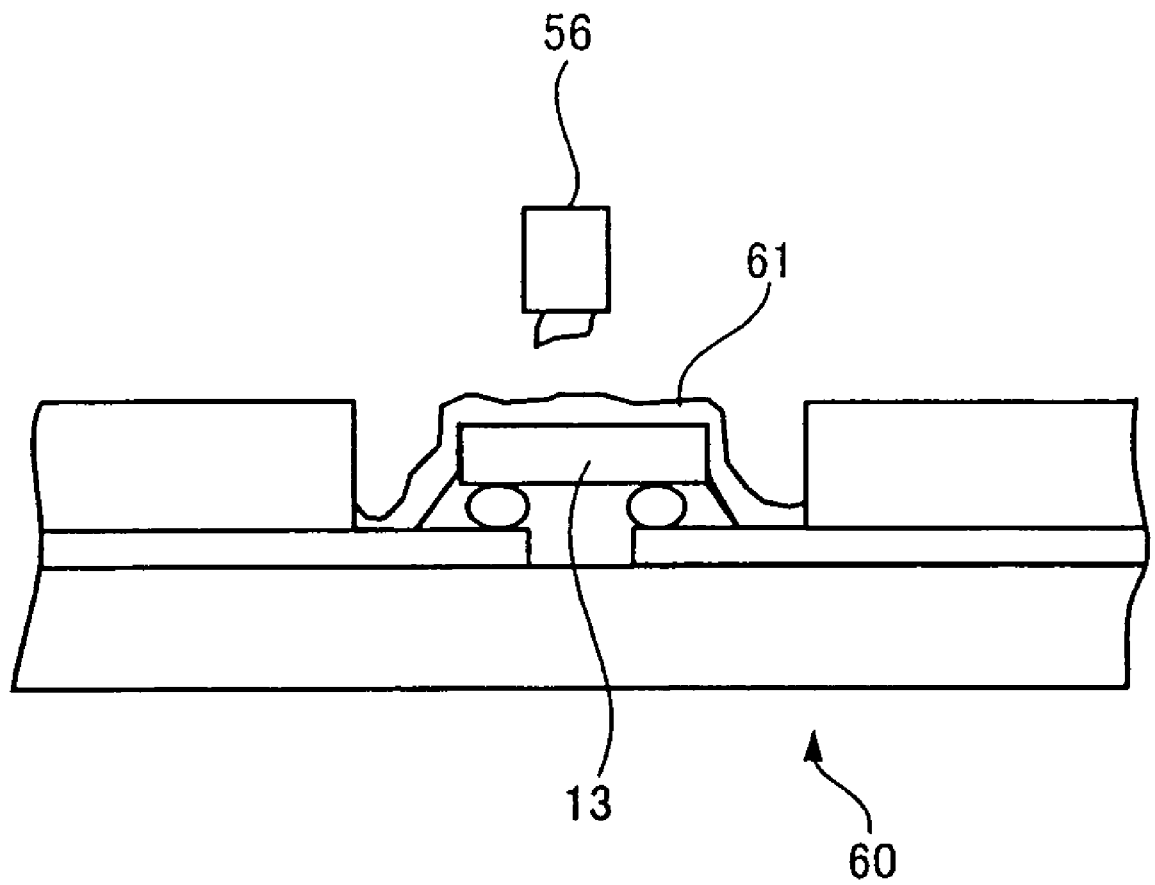
FIG. 10 is a drawing that shows another manufacturing method in the second embodiment of the invention.

FIG. 10 is a drawing that shows another manufacturing method in the second embodiment of the invention.

A thermal diffusion material 61 in the RFID tag 60 of the second embodiment can also be formed by applying the above-described liquid ceramic paint by use of a dispenser 56 and causing the liquid ceramic paint to solidify by drying or the like.

Thus, in the RFID tag 60 of the second embodiment the manufacture of the thermal diffusion material 61 is easy and cost reduction is expected.

Figure 11:
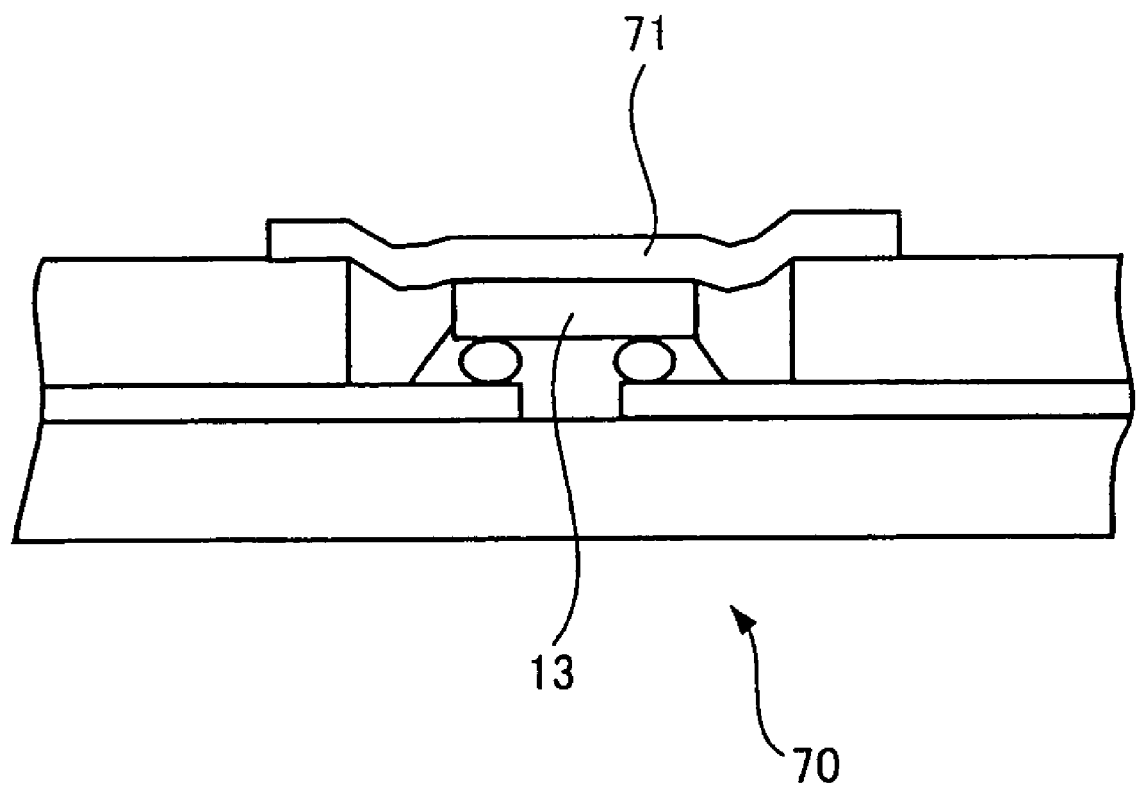
FIG. 11 is a drawing that shows the third embodiment of the invention.

FIG. 11 is a drawing that shows the third embodiment of the invention.

An RFID tag 70 of the third embodiment is provided with a thermal diffusion material 71 formed from a silicone rubber sheet and this thermal diffusion material 71 is bonded directly to the IC chip 13. Because this thermal diffusion material 71 has a very simple construction, its manufacturing cost is thought to be held down. Incidentally, although it might be thought that the capacity for thermal diffusion in the third embodiment is inferior to the capacity for thermal diffusion in the first embodiment mentioned above, it is expected that the third embodiment is superior to conventional techniques and, therefore, sufficient usability is expected under some service conditions.

Figure 12:
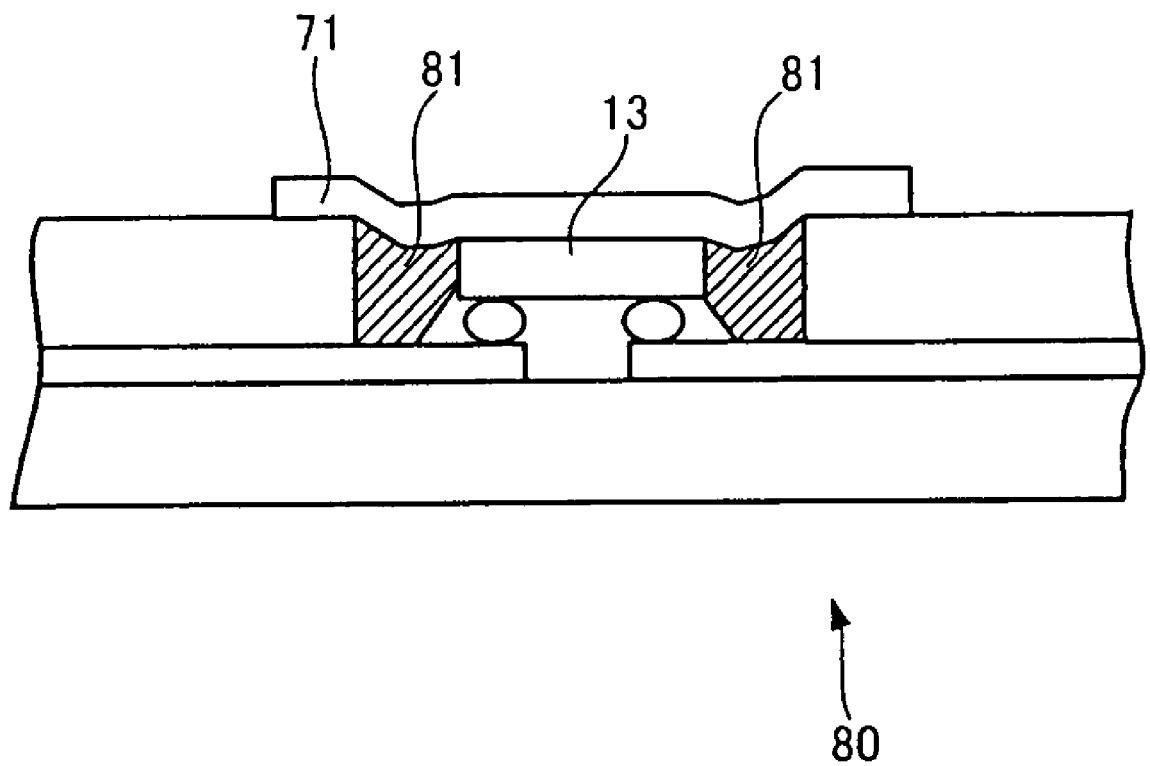
FIG. 12 is a drawing that shows the fourth embodiment of the invention.

FIG. 12 is a drawing that shows the fourth embodiment of the invention.

An RFID tag 80 of the fourth embodiment is also provided with the same thermal diffusion material 71 formed from a silicone rubber sheet as with the RFID tag of the third embodiment and the area around the IC chip 13 is embedded with a silicone grease 81 to improve thermal diffusion properties. In this RFID tag 80, both cost reduction and an improvement in thermal diffusion properties are achieved and its applications are thought to be wide.

Figure 13:
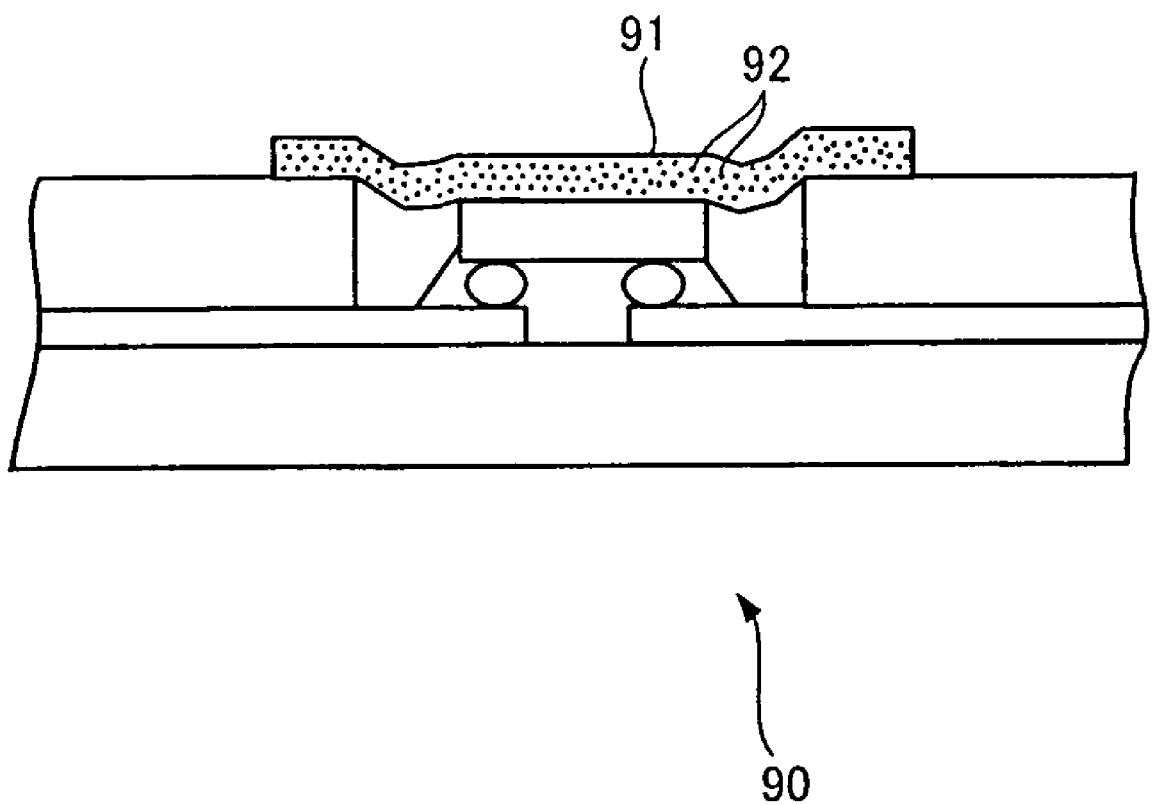
FIG. 13 is a drawing that shows the fifth embodiment of the invention.

FIG. 13 is a drawing that shows the fifth embodiment of the invention.

An RFID tag 90 of the fifth embodiment is provided with a thermal diffusion material 91 that is formed by mixing a ceramic ($Al_2O_3$: alumina, $SiO_2$: silica) granule 92 of high thermal conductivity into an insulating silicone sheet. As with the thermal diffusion material 15 in the first embodiment, this thermal diffusion material 91 is bonded with an adhesive.

Because in this thermal diffusion material 91, thermal conductivity can be easily adjusted by adjusting the kind and mixed amount of granule 92, the thermal diffusion material 91 of high thermal conductivity can be easily obtained.

Although in the above description, a cover sheet in which holes are made beforehand in the perforation step is shown as an example of the cover of the present invention, the cover of the invention may be such that the cover once covers the whole base and after that, part of the cover in an area near the circuit chip is stripped off.

Also, in the above description, the base sheet or the cover sheet is shown as an example of the base or cover of the invention. However, the shape of the base or cover of the invention is not limited to the sheet.

Also, in the above description, a protective part obtained by sticking a thermal diffusion material is shown as an example of the protective part of the invention. However, the protective part of the invention may be a part shaped like a projection formed in the thermal diffusion material before affixing the thermal diffusion material to the circuit chip.

What is claimed is:

1. A method of manufacturing an RFID tag, comprising:
providing a cover in close contact with a base in such a manner as to cover an antenna pattern except a chip-mounted region where a circuit chip is mounted on the base, the circuit chip electrically-connected to the antenna pattern, the antenna pattern provided on the base;
providing a thermal diffusion material in thermal contact with the circuit chip by covering a prescribed region with the thermal diffusion material, wherein the thermal diffusion material has a thermal conductivity higher than the cover; and
testing an operation of the circuit chip after said providing the cover in close contact with the base,
wherein the thermal diffusion material is bonded on the circuit chip when the circuit chip has passed the operation test.

2. The method of manufacturing an RFID tag according to claim 1, wherein said providing the cover in close contact with the base includes perforating a hole on a laminate film forming the cover; and laminating the laminate film on the base while positioning the hole at the chip-mounted region.

3. The method of manufacturing an RFID tag according to claim 1, wherein the operation test of the circuit chip is performed in a region enclosed with electromagnetic shields.

4. The method of manufacturing an RFID tag according to claim 1, wherein the thermal diffusion material is bonded on the circuit chip via silicone grease.

5. The method of manufacturing an RFID tag according to claim 1, wherein the thermal diffusion material is an electrically-insulating thermal diffusion material.

* * * * *